(12) United States Patent
Nagai

(10) Patent No.: US 6,445,613 B1
(45) Date of Patent: Sep. 3, 2002

(54) MAGNETIC RANDOM ACCESS MEMORY

(75) Inventor: Yukihiro Nagai, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/753,674

(22) Filed: Jan. 4, 2001

(30) Foreign Application Priority Data

Jun. 16, 2000 (JP) ........................................ 2000-181414

(51) Int. Cl.[7] .............................................. G11C 11/00
(52) U.S. Cl. ..................... 365/171; 365/173; 365/225.5; 365/232; 365/97; 365/99
(58) Field of Search ........................... 365/97, 99, 158, 365/171, 173, 225.5, 232

(56) References Cited

U.S. PATENT DOCUMENTS

| | | | | |
|---|---|---|---|---|
| 5,748,519 A | * | 5/1998 | Tehrani et al. | 365/98 |
| 5,838,608 A | * | 11/1998 | Zhu et al. | 365/158 |
| 5,946,227 A | * | 8/1999 | Naji | 365/158 |
| 6,034,887 A | * | 3/2000 | Gupta et al. | 365/171 |
| 6,097,625 A | * | 8/2000 | Scheuerlein | 365/171 |
| 6,191,972 B1 | * | 2/2001 | Miura et al. | 365/171 |
| 6,215,707 B1 | * | 4/2001 | Moyer | 365/189.07 |
| 6,278,631 B1 | * | 8/2001 | Naji | 365/158 |
| 6,314,020 B1 | * | 11/2001 | Hansen et al. | 365/158 |

* cited by examiner

*Primary Examiner*—Viet Q. Nguyen
(74) *Attorney, Agent, or Firm*—McDermott, Will & Emery

(57) ABSTRACT

A magnetic random access memory or the like has a plurality of magnetic storage elements laminated on a single transistor, resulting in a reduction in the number of necessary components and a considerable enhancement in the degree of integration of the memory. A magnetic random access memory or the like, comprises a plurality of magnetic storage elements for magnetically storing information, a plurality of bit lines, each of which connected to each of the plurality of magnetic storage elements, a plurality of writing word lines, each of which is provided in correspondence to the vicinity of each of the plurality of magnetic storage elements and utilized for applying magnetic field to write the information, a single reading word line, and a switch including a first terminal and a second terminal, the first terminal being connected to the single reading word line to be utilized for determining whether current is caused to flow to the second terminal, the second terminal being connected to each of the plurality of magnetic storage elements.

17 Claims, 10 Drawing Sheets

140

MAGNETIC RANDOM ACCESS MEMORY

BACKGROUND OF THE INVENTION

1. Field of the Invention

The present invention relates to a magnetic random access memory for magnetically storing information by utilizing a magnetic storage element. More specifically, the present invention relates to a structure of the magnetic random access memory, a method of accessing the magnetic random access memory and a method of manufacturing the magnetic random access memory.

2. Description of the Related Art

In recent years, a magnetic random access memory (MRAM) has vigorously been studied. The magnetic random access memory implies a nonvolatile memory for recording data by utilizing the magnetism of a magnetic storage element. FIG. 1A is a diagram of a memory cell 150 of the magnetic random access memory. The memory cell 150 is constituted by one magnetic storage element 151 and a metal oxide film semiconductor field effect transistor (MOSFET) 152. A writing word line 154 for writing information to the magnetic storage element 151 is provided in the vicinity of the magnetic storage element 151. The transistor 152 has a first electrode 152-1 connected to a reading word line 155 for reading information from the magnetic storage element 151 and has a second electrode 152-2 connected to the magnetic storage element 151. A third electrode 152-3 of transistor 152 is grounded. Moreover, a bit line 153 is connected to the magnetic storage element 151. The bit line 153 is utilized for writing information to the magnetic storage element 151 and reading the information from the magnetic storage element 151. According to the above description, apparently, the memory cell 150 has such a structure that one magnetic storage element 151 is present for one reading word line 155 and one transistor 152.

FIG. 1B is a sectional view of the memory cell 150. As shown, the magnetic storage element 151, the bit line 153 and the writing word line 154 are stacked on the reading word line 155 or the transistor 152. The magnetic storage element 151 is smaller than the transistor 152. Therefore, the size of the memory cell 150 is determined by the size of the transistor 152. Accordingly, if the size of the transistor 152 is reduced, a cell area is decreased correspondingly so that the degree of integration can be enhanced.

However, an enhancement in the degree of integration based on a reduction in the size of the transistor 152 also has limitations. In more detail, it is necessary to determine the resistance of the transistor 152 corresponding to the characteristic of a film depending on a GMR element or a TMR element to be used as the magnetic storage element 151. However, the resistance of the transistor 152 also depends on a dimension thereof (condition 1). Furthermore, one transistor 152 is always present in one memory cell 150 (condition 2). Accordingly, the size and number of the transistors 152 which can be integrated into a chip having a constant area are considerably restricted according to the conditions 1 and 2. Therefore, it is impossible to obtain a memory having a small area, the small number of elements and a large capacity.

SUMMARY OF THE INVENTION

It is an object of the present invention to provide a magnetic random access memory in which the degree of integration of a memory is enhanced and the number of necessary components is small through the provision of a plurality of magnetic storage elements on a single transistor.

It is another object of the present invention to provide a method of writing information to the magnetic random access memory and a method of manufacturing the magnetic random access memory.

The present invention provides a magnetic random access memory comprising a plurality of magnetic storage elements for magnetically storing information, respectively, a plurality of bit lines connected to the magnetic storage elements, respectively, a plurality of writing word lines provided corresponding to the vicinity of the magnetic storage elements and utilized for applying magnetic field to write the information, respectively, and a switch including a first terminal and a second terminal, the first terminal being connected to a single reading word line to be utilized for determining whether current is caused to flow to the second terminal and the second terminal being connected to each of the magnetic storage elements. Consequently, the above-mentioned object can be achieved.

Preferably, the switch further include a third terminal which is different from both the first terminal and the second terminal and to which a predetermined voltage is applied, current flowing to the second terminal through the third terminal based on the voltage applied to the first terminal.

Preferably, the magnetic storage elements are laminated in a vertical direction to the switch.

Preferably, the writing word line is orthogonal to the bit line and the magnetic storage element is positioned between the writing word line and the bit line.

The present invention provides a method of writing information to a magnetic random access memory, comprising the steps of causing bit line writing current to flow to an object bit line corresponding to an object magnetic storage element, causing word line writing current to flow to an object writing word line corresponding to the object magnetic storage element, and changing a direction of magnetization of the object magnetic storage element into a direction corresponding to the information through the magnetic field generated by the bit line writing current and the word line writing current. Consequently, the above-mentioned object can be achieved.

Preferably, the method of writing information further comprises the step of causing current to flow to at least one bit line other than the object bit line.

Preferably, the current to flow to the at least one bit line has a smaller magnitude than that of the bit line writing current.

Preferably, at the step of causing current to flow to the at least one bit line, a direction of current flow is changed corresponding to a positional relationship between the at least one bit line and the object bit line.

Preferably, at the step of causing current to flow to the at least one bit line, the current is caused to flow in the same direction as the object bit line if the at least one bit line is positioned above the object bit line, and the current is caused to flow in a reverse direction to the object bit line if the at least one bit line is positioned below the object bit line.

Preferably, the information is recorded to represent an N-digit binary number by using the N magnetic storage elements.

The present invention provides a method of reading information from an object magnetic storage element, comprising the steps of applying a reading word line voltage to a single reading word line, causing bit line reading current to flow to an object bit line corresponding to the object magnetic storage element, detecting a terminal voltage of the object magnetic storage element, and deciding contents of the stored information based on the terminal voltage. Consequently, the above-mentioned object can be achieved.

Preferably, the method of reading information from the magnetic random access memory further comprises the steps of causing reference current to flow to a reference bit line different from the object bit line, detecting a reference terminal voltage of the magnetic storage element connected to the reference bit line, and deciding contents of the stored information based on the reference terminal voltage and the terminal voltage.

The present invention provides a method of manufacturing a magnetic random access memory, comprising the steps of (a) providing a substrate, (b) forming a single transistor including a first electrode, a second electrode and a third electrode on the substrate, the second electrode being conducted to the third electrode corresponding to a voltage to be applied to the first electrode, (c) forming a writing word line insulated from the single transistor, (d) forming a magnetic storage element connected to the second electrode of the single transistor for storing information in the vicinity of the writing word line, (e) forming a bit line connected to the magnetic storage element and insulated from the writing word line, and (f) repeating the steps (c) to (e). The above-mentioned object can be achieved.

For example, at the steps (c) to (f), the writing word line, the magnetic storage element and the bit line are laminated in a vertical direction to the single transistor formed on the substrate.

For example, the step (d) further includes the step of forming a single reading word line to be connected to the first electrode.

Preferably, at the steps (c) to (e), the writing word line is orthogonal to the bit line, and the writing word line, the magnetic storage element and the bit line are formed such that the magnetic storage element is positioned between the writing word line and the bit line.

Preferably, the step (b) further includes the step of giving a predetermined voltage to the third electrode.

According to the magnetic random access memory of the present invention, a plurality of magnetic storage elements are connected to a single transistor. Therefore, it is possible to obtain a memory having the small number of components and high degree of integration. More specifically, the magnetic storage elements are laminated in the vertical direction to the transistor. Therefore, the degree of integration can be enhanced dramatically.

BRIEF EXPLANATION OF THE DRAWINGS

The above and further objects and features of the invention will more fully be apparent from the following detailed description with accompanying drawings.

DETAILED DESCRIPTION OF THE PREFERRED EMBODIMENT

Figure 1A:
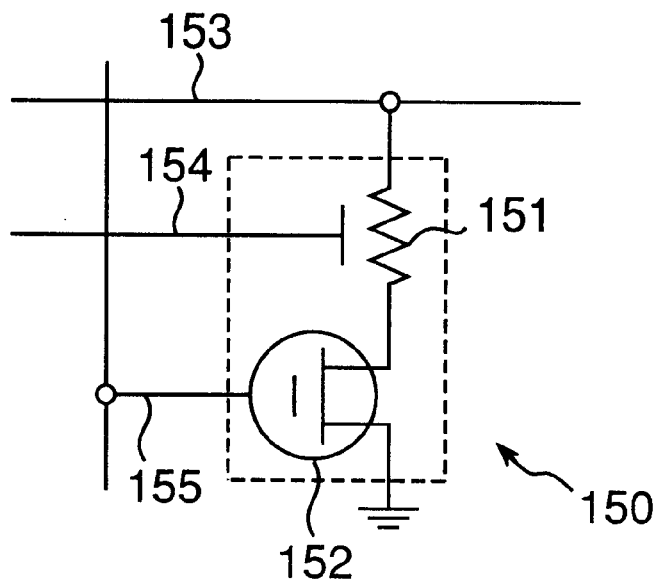
FIGS. 1A and 1B are schematic and sectional views of a memory cell of a magnetic random access memory.
Figure 1B:
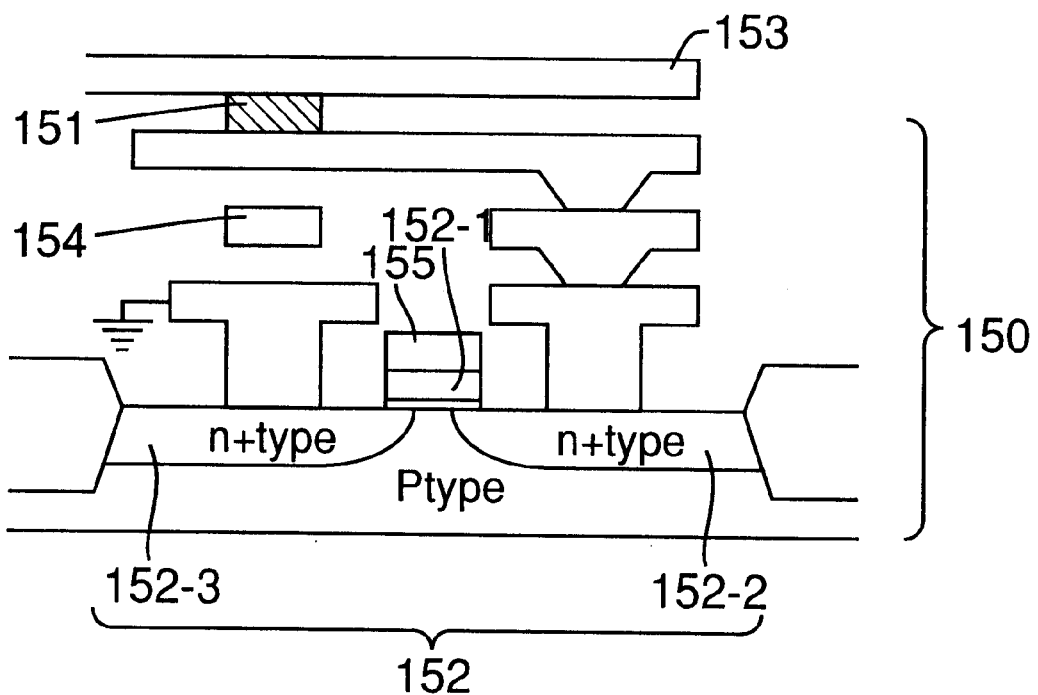

An embodiment of the present invention will be described below with reference to the accompanying drawings. In the drawings, the same reference numerals denote the same or equivalent components.

Figure 2:
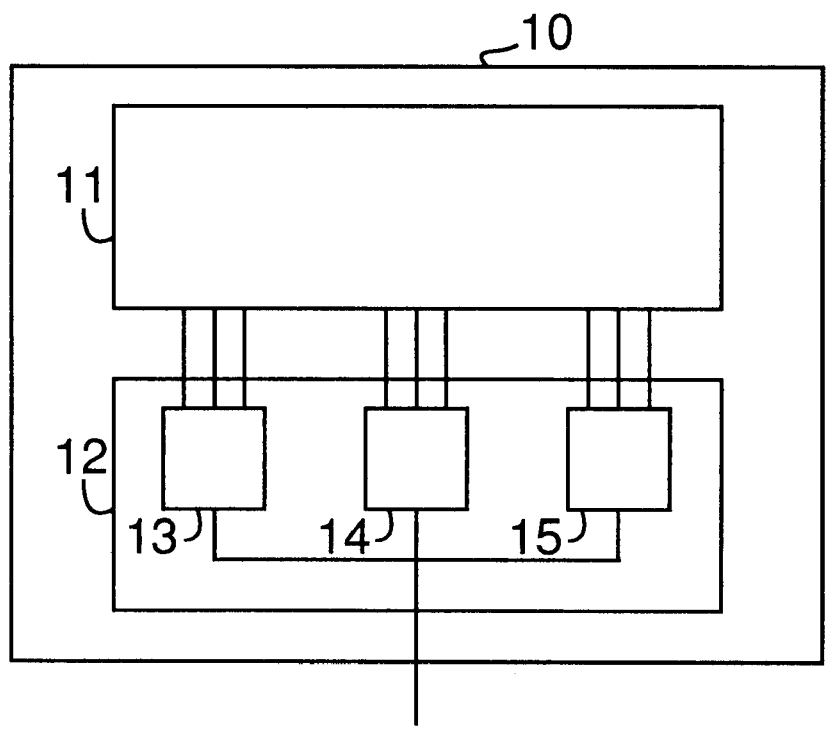
FIG. 2 is a diagram of a magnetic random access memory according to the present invention.

FIG. 2 shows a magnetic random access memory 10 according to an embodiment of the present invention. The magnetic random access memory 10 comprises a memory array 11 and a driving circuit 12 thereof. The magnetic random access memory 10 functions to store, in the memory array 11, information received from a central processing unit (not shown) of a computer or the like, for example, or to transmit the information read from the magnetic random access memory 11 to the central processing unit (not shown) or the like. The memory array 11 is constituted by a plurality of memory cell units (not shown). The driving circuit 12 is constituted to selectively drive a plurality of driving lines, respectively. In other words, the driving circuit 12 includes a bit line driving circuit 13 for driving a bit line, a writing word line driving circuit 14 for driving a writing word line, and a reading word line driving circuit 15 for driving a reading word line. By these circuits, a desirable memory cell unit in the memory array 11 is specified and a magnetic storage element in the memory cell unit is further specified. Consequently, the storage of information or the read of the stored information can be controlled.

Figure 3A:
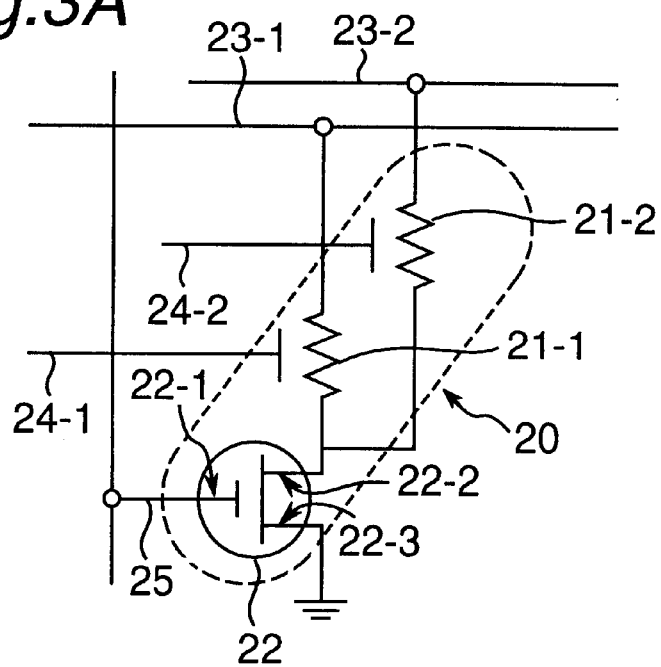
FIGS. 3A and 3B are schematic and sectional views of a magnetic memory cell unit according to the present invention.
Figure 15:
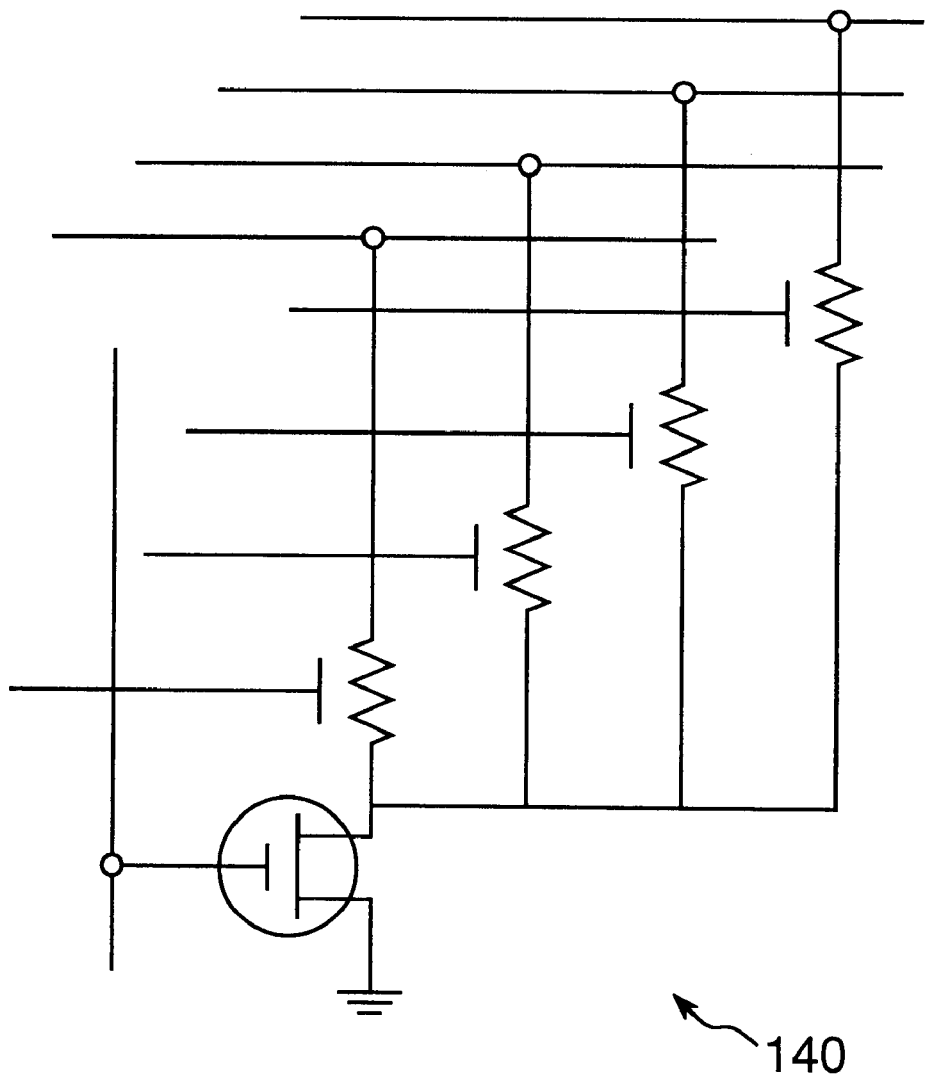
FIG. 15 is a diagram of a magnetic memory cell unit including four magnetic storage elements.

FIG. 3A is a schematic view of a magnetic memory cell unit 20 according to the present invention. The magnetic memory cell unit 20 is constituted by two magnetic storage elements 21-1 and 21-2 and one metal oxide film semiconductor field effect transistor (MOSFET) 22. The metal oxide film semiconductor field effect transistor will be hereinafter referred to as a "transistor". The two magnetic storage elements 21-1 and 21-2 serve to store 1-bit information, respectively. The number of the magnetic storage elements is not restricted to two but may be four or the like as shown in FIG. 15. Thus, a plurality of magnetic storage elements may be integrated. On the other hand, the transistor 22 is utilized as a switch for selecting the specific magnetic memory cell unit 20 when reading the information. With the above-mentioned structure, the number of necessary components can be decreased and the degree of integration of the memory can be dramatically enhanced in a different respect from a reduction in the size of the transistor 22. For example, if the number of magnetic storage elements included in the single magnetic memory cell unit 20 is set to N, N-fold information can be stored in the same area as that of a conventional magnetic random access memory.

The magnetic memory cell unit 20 will be described below. Writing word lines 24-1 and 24-2 for writing information in the magnetic storage elements 21-1 and 212 are provided in the vicinity of the magnetic storage elements 21-1 and 21-2, respectively. A reading word line 25 for reading information from the magnetic storage elements 21-1 and 21-2 is connected to a first electrode 22-1 of the transistor 22, and both of the magnetic storage elements 21-1 and 21-2 are connected to a second electrode 22-2. A third electrode 22-3 of the transistor 22 is grounded and receives a reference voltage (0 V). Moreover, bit lines 23-1 and 23-2 are further connected to terminals of the magnetic storage elements 21-1 and 21-2. The bit lines 23-1 and 23-2 are utilized for writing information to the magnetic storage elements 21-1 and 21-2 and for reading the information from the magnetic storage elements 21-1 and 21-2. According to the above description, the magnetic memory cell unit 20 according to the present invention has such a structure that two magnetic storage elements 21-1 and 21-2 are present for one transistor 22 or one reading word line 25.

Before the explanation of the physical structure of the magnetic memory cell unit 20, description will be given to a general operation for reading/writing information from/to the magnetic storage element with reference to FIGS. 4A to 4D. FIGS. 4A to 4D shows an operation principle for storing information in the magnetic storage element 31 and reading the information from the magnetic storage element 31.

Figure 4A:
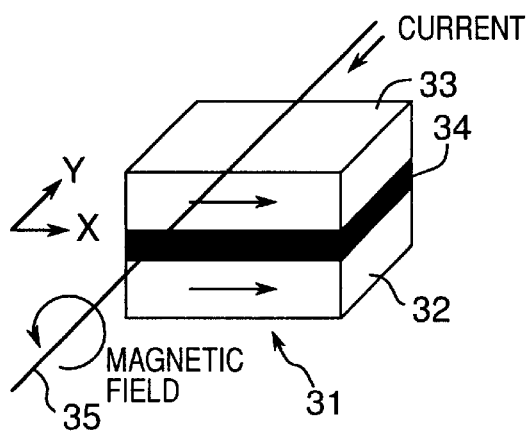
FIGS. 4A to 4D are diagrams of an operation principle for storing information in a magnetic storage element and reading the information from the magnetic storage element.

First of all, a method of storing information in the magnetic storage element 31 will be described. The information is stored by applying magnetic field to the magnetic storage element 31 and changing the direction of magnetization of a ferromagnetic layer. FIG. 4A shows the magnetic storage element 31 storing information (state) "0". The magnetic storage element 31 is constituted by a lower ferromagnetic layer 32, an upper ferromagnetic layer 33 and a non-magnetic layer 34 interposed therebetween. It is preferable that the magnetic storage element 31 should be a TMR (Tunneling Magnetoresistive) element and a GMR (Giant Magnetoresistive) element, for example. A writing word line 35 for writing information to the magnetic storage element 31 is provided in the vicinity of the magnetic storage element 31. In general, in the case in which the direction of magnetization of the lower ferromagnetic layer 32 of the magnetic storage element 31 is identical to that of magnetization of the upper ferromagnetic layer 33 (each magnetization is turned in the positive direction of an X axis, in this example), it is assumed that the magnetic storage element 31 stores "0". The direction of the magnetization of the lower ferromagnetic layer 32 (the ferromagnetic layer 32 positioned farther from the writing word line 35) is designed so as not to be changed from the positive direction of the X axis. In order to cause the direction of the magnetization of the lower ferromagnetic layer 32 of the magnetic storage element 31 to be identical to that of the magnetization of the upper ferromagnetic layer 33, current should flow to the writing word line 35 in the negative direction of a Y axis. The reason is that magnetic field is generated clockwise around the writing word line 35 and magnetic field in the positive direction of the X axis can be applied to the upper ferromagnetic layer 33. Thus, the information "0" is stored in the magnetic storage element 31.

Figure 4B:
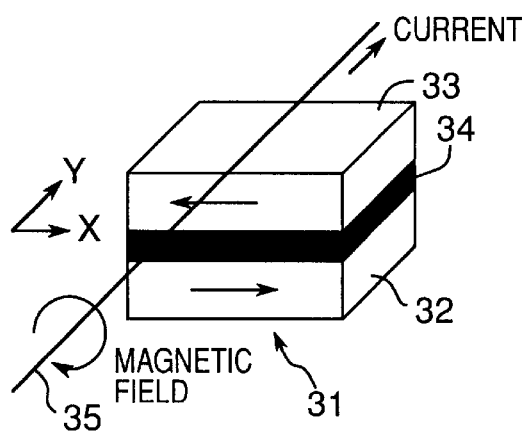

FIG. 4B shows the magnetic storage element 31 storing information "1". In general, in the case in which the direction of the magnetization of the lower ferromagnetic layer 32 of the magnetic storage element 31 is reverse to that of the magnetization of the upper ferromagnetic layer 33 (the direction of the magnetization of the lower ferromagnetic layer 32 is turned in the X axis direction and the direction of the magnetization of the upper ferromagnetic layer 33 is turned in the Y axis direction), it is assumed that the magnetic storage element 31 stores "1". In order to thus set the directions of the magnetization of the respective ferromagnetic layers, current should flow to the writing word line 35 in the positive direction of the Y axis and magnetic field should be applied to the upper ferromagnetic layer 33 in the negative direction of the X axis. The direction of the magnetization of the lower ferromagnetic layer 32 is designed so as not to be changed through the magnetic field (the magnitude of the current is regulated). Thus, the information "1" is stored in the magnetic storage element 31.

Figure 4C:
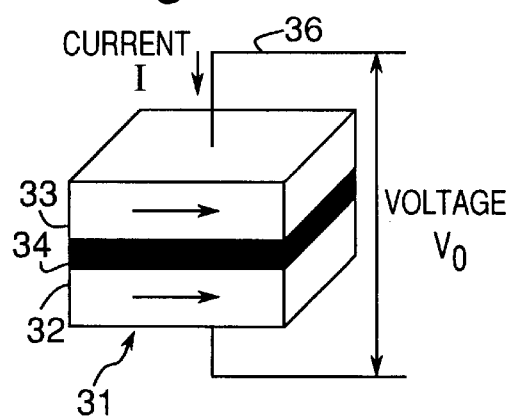

A method of reading information from the magnetic storage element 31 will be described below. The information is read by causing constant current I to flow in a vertical direction to the multilayered surface of the magnetic storage element 31, thereby detecting a voltage on both ends of the magnetic storage element 31. FIG. 4C shows the magnetic storage element 31 from which the information "0" is read. First of all, the constant current I is caused to flow to a bit line 36 laminated in the vertical direction to the multilayered surface of the magnetic storage element 31. The current I flows in the magnetic storage element 31. Then, a voltage $V_0$ on both ends of the magnetic storage element 31 is detected. It is known that the resistance of the magnetic storage element 31 is comparatively low if the direction of the magnetization of the lower ferromagnetic layer 32 of the magnetic storage element 31 is identical to that of the magnetization of the upper ferromagnetic layer 33. Accordingly, the detected voltage $V_0$ is also reduced.

Consequently, it is possible to decide that the information stored in the magnetic storage element 31 is "0". Based on the magnitude of the flowing current I and the detected voltage $V_0$, a resistance value $R_0$ is calculated with $R_0=V_0/I$. By deciding that the resistance value $R_0$ is comparatively small, it is also possible to decide that the information stored in the magnetic storage element 31 is "0".

Figure 4D:
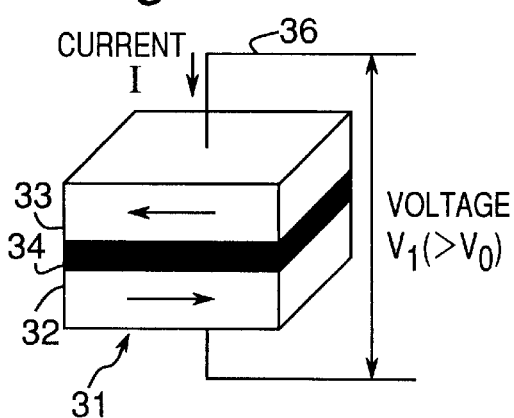

FIG. 4D shows the magnetic storage element 31 from which the information "1" is read. Also in this case, similarly, the constant current I is caused to flow to the bit line 36 laminated in the vertical direction to the multilayered surface of the magnetic storage element 31. Then, a voltage $V_1$ on both ends of the magnetic storage element 31 is detected. It is known that the resistance of the magnetic storage element 31 is comparatively high if the direction of the magnetization of the lower ferromagnetic layer 32 of the magnetic storage element 31 is reverse to that of the magnetization of the upper ferromagnetic layer 33. Accordingly, the voltage $V_1$ on both ends of the magnetic storage element 31 thus detected is increased ($V_1>V_0$) Consequently, it is possible to decide that the information stored in the magnetic storage element 31 is "1". Based on the magnitude of the flowing current I and the detected voltage $V_1$, a resistance value $R_1$ is calculated with $R_1=V_1/I$. By deciding that the resistance value $R_1$ is comparatively great, it is also possible to decide that the information stored in the magnetic storage element 31 is "1".

Figure 3B:
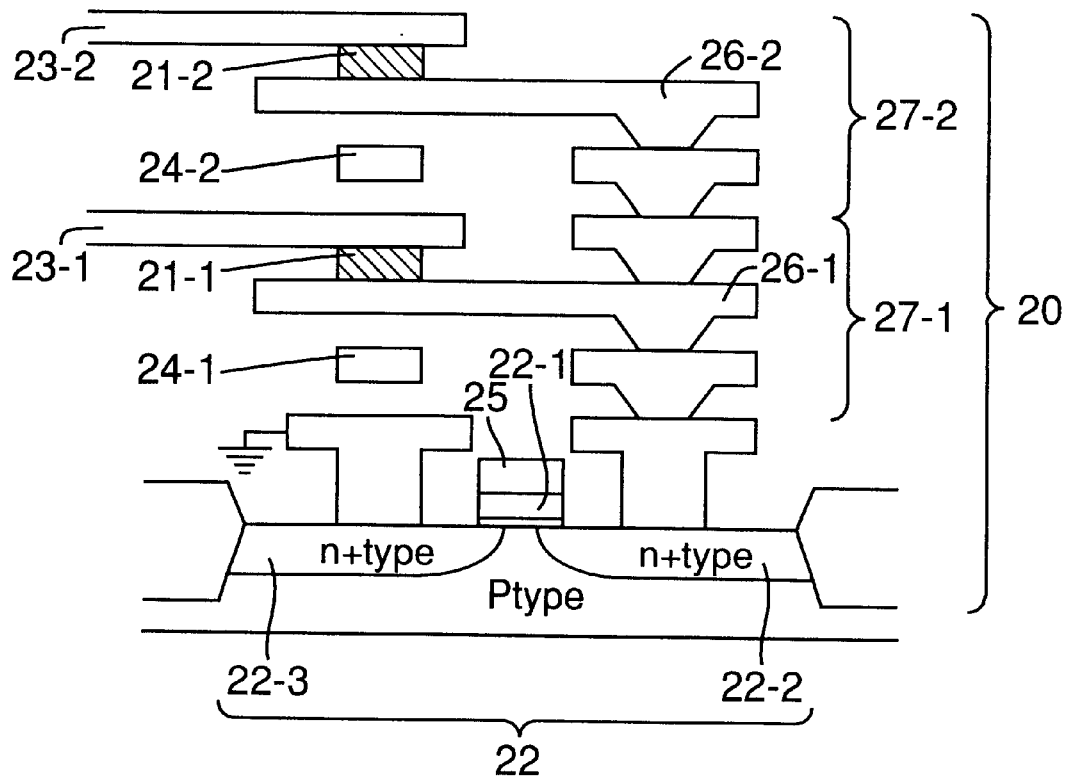

The method of storing the information in the magnetic storage element and reading the information from the magnetic storage element has been described above. The structure of the magnetic memory cell unit 20 according to the present invention will be described below with reference to FIG. 3B. FIG. 3B is a sectional view of the magnetic memory cell unit 20 of FIG. 3A. The magnetic memory cell unit 20 is constituted by providing a reading word line 25, a first cell 27-1 and a second cell 27-2 in order in the vertical direction to the transistor 22 formed on the substrate. The transistor 22 has a first electrode 22-1 connected to the reading word line 25 and a third electrode 22-3 grounded, to which a reference voltage (0 V) is applied. A second electrode 22-2 of the transistor 22 is connected to each of the first cell 27-1 and the second cell 27-2.

In the first cell 27-1, a writing word line 24-1, a lower electrode 26-1, a magnetic storage element 21-1 and a bit line 23-1 are laminated in a vertical direction to the substrate in order from the substrate side. As described with reference to FIG. 3A, components other than the writing word line 24-1 are connected to the second electrode 22-2 of the transistor 22. In the second cell 27-2, similarly, a writing word line 24-2, a lower electrode 26-2, a magnetic storage element 21-2 and a bit line 23-2 are laminated in the vertical direction to the substrate in order from the substrate side. Components other than the writing word line 24-2 are connected to the second electrode 22-2 of the transistor 22 through the lower electrode 26-1. An insulating layer is formed in a region provided around a region where the above-mentioned components are present.

The structure of the first cell 27-1 will be described below in more detail. In the first cell 27-1, the writing word line 24-1 is extended in a vertical direction to the paper and is provided in the vicinity of the magnetic storage element 21-1. The writing word line 24-1 applies magnetic field based on flowing current to the magnetic storage element 21-1. The magnetic storage element 21-1 is provided between the lower electrode 26-1 and the bit line 23-1. The bit line 23-1 is also utilized for writing information to the magnetic storage element 21-1 and is not arranged in parallel with the writing word line 24-1 but orthogonally thereto, for example. Accordingly, it is apparent that the magnetic storage element 21-1 is provided between the bit line 23-1 and the writing word line 24-1. Since the structure of the second cell 27-2 is the same as that of the first cell 27-1, description thereof will be omitted.

The bit line 23-1 is not provided in parallel with the writing word line 24-1 for the following reason. As described with reference to FIGS. 4A and 4B, if one writing word line 35 is provided, the information "0" or "1" can be written to the magnetic storage element 31. In a magnetic random access memory which has been studied and developed, however, information is written by utilizing two current lines, that is, a writing word line and a bit line in consideration of the case in which a large number of magnetic storage elements are integrated. The magnitude of a voltage to be applied, that is, flowing current is regulated such that magnetic field required for the inversion of magnetization is not generated with only current flowing to one of the writing word line and the bit line. On the other hand, magnetic field is generated by each current and the sum of two magnetic field (composite magnetic field) is applied to the magnetic storage element in a position where the current flows to both the writing word line and the bit line. By setting the magnitude of the composite magnetic field to be enough for the inversion of the magnetization, information can be written to only the magnetic storage element positioned on an intersection of the writing word line and the bit line. In other words, the writing word line and the bit line which are present above and under a desirable magnetic storage element are selected to cause current to flow. Consequently, the composite magnetic field is applied to the desirable magnetic storage element so that the information can be written to only the magnetic storage element. Accordingly, it is required that the writing word line and the bit line are not provided in parallel with each other. The writing word line driving circuit 14 (FIG. 2) and the bit line driving circuit 13 (FIG. 2) control the selection of the writing word line and the bit line.

The process of manufacturing the magnetic memory cell unit 20 (FIG. 3B) will be described below with reference to FIGS. 5 to 14. In each drawing, the process of manufacturing the magnetic memory cell unit 20 (FIG. 3B) is shown sequentially. By integrating the magnetic memory cell unit 20 (FIG. 3B) manufactured in the following manner with the driving circuit 12 (FIG. 2), the magnetic random access memory 10 (FIG. 2) can be obtained easily. For the driving circuit 12 (FIG. 2), a well-known driving circuit which is operated as will be described below can be utilized. Accordingly, the process of manufacturing the driving circuit 12 (FIG. 2) and the magnetic random access memory 10 (FIG. 2) will not be described specifically. In the following, the reference numerals denote necessary portions for the description of each drawing and are not attached to the components which have been described, and corresponding portions in each drawing represent the same components.

Figure 5:
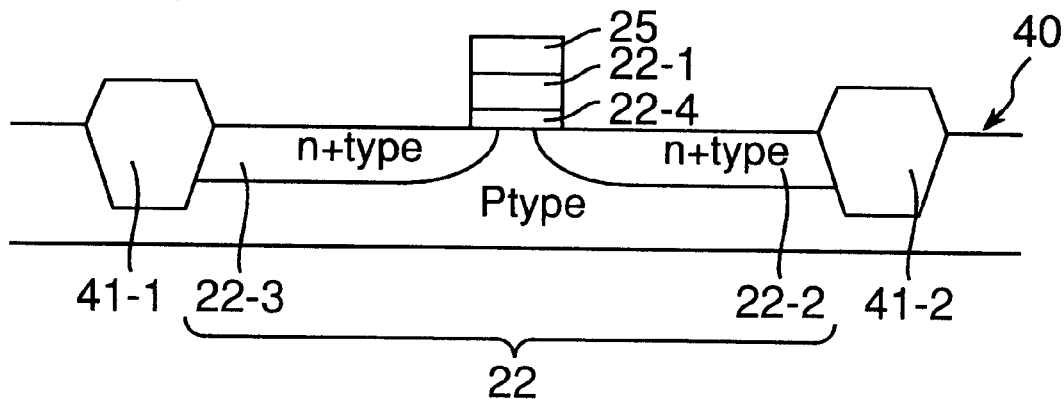
FIG. 5 is a diagram of a substrate in which a transistor and a reading word line are formed.

FIG. 5 shows a substrate 40 in which the transistor 22 and the writing word line 25 are formed. The forming process is as follows. First of all, a plurality of transistors are formed on a Si substrate 40. Only the transistor 22 (N-channel MOSFET) is shown. The N channel MOSFET can be fabricated by burying two n-type regions (electrodes) 22-2 and 22-3 having high impurity concentrations close to each other in a P-type silicon substrate 40, depositing a thin oxide film ($SiO_2$) 22-4 on both of the electrodes 22-2 and 22-3, and finally depositing Al, Au or the like thereon to form a gate electrode (first electrode) 22-1. At the same time, element isolating regions 41-1 and 41-2 are formed by using TEOS (Tetra Etyl Ortho Silicate) or the like in order to electrically insulate the transistors from each other. A reading word line 25 is formed on the first electrode 22-1 of the transistors 22 thus formed.

Figure 6:
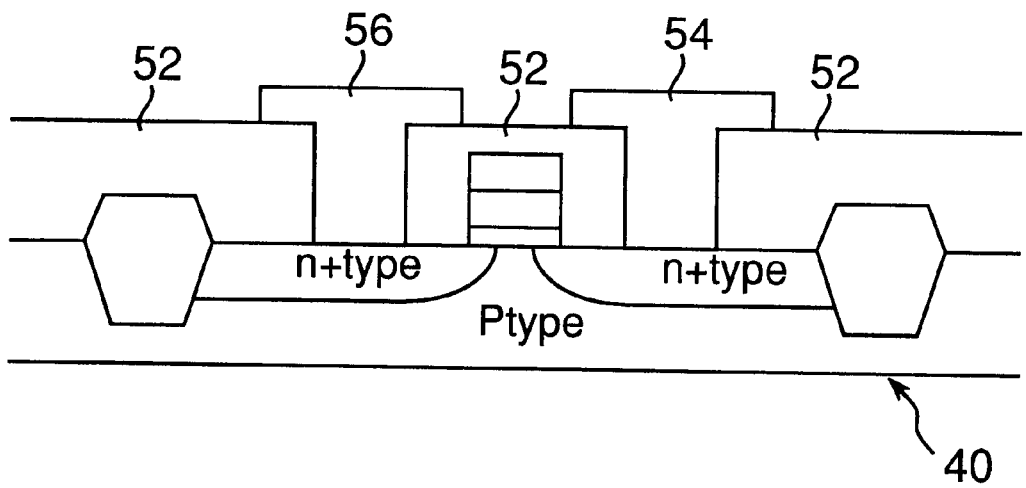
FIG. 6 is a diagram of the substrate in which a first isolated plug and a ground connection wiring are further formed.

FIG. 6 shows the substrate 40 in which a first isolated plug 54 and a ground connection wiring 56 are further formed. The ground connection wiring 56 is grounded. An interlayer insulating film 52 is present in a region provided around the first isolated plug 54 and the ground connection wiring 56.

The process of forming such a substrate 40 is as follows.

(5-1) First of all, the interlayer insulating film 52 comprising $SiO_2$ is formed on the substrate 40, for example, by utilizing CVD (Chemical Vapor Deposition).

(5-2) A photoresist is applied on the substrate 40 and ultraviolet rays are irradiated through a photomask. Consequently, a desirable resist pattern is obtained. This step is referred to as lithography. The photomask is prepared based on the positions of the first isolated plug 54 and the ground connection wiring 56 where a contact hole is to be provided and shapes thereof.

(5-3) The $SiO_2$ in the resist pattern portion is removed by etching and the applied photoresist is removed. Thus, the contact holes of the first isolated plug 54 and the ground connecting wiring 56 are provided.

(5-4) A metal is deposited on the contact hole. In a normal depositing process, the metal is deposited on the surface of the interlayer insulating film 52 in addition to the contact hole. In order to form the first isolated plug 54 and the ground connection wiring 56 to have desirable shapes, accordingly, the lithography and the etching are carried out again to remove the unnecessary deposited metal. Finally, the ground connection wiring 56 is grounded.

As described above, the interlayer insulating film 52, the first isolated plug 54 and the ground connection wiring 56 are formed. Since the lithography, the etching and the deposition are known well, specific description will be omitted in this specification.

Figure 7:
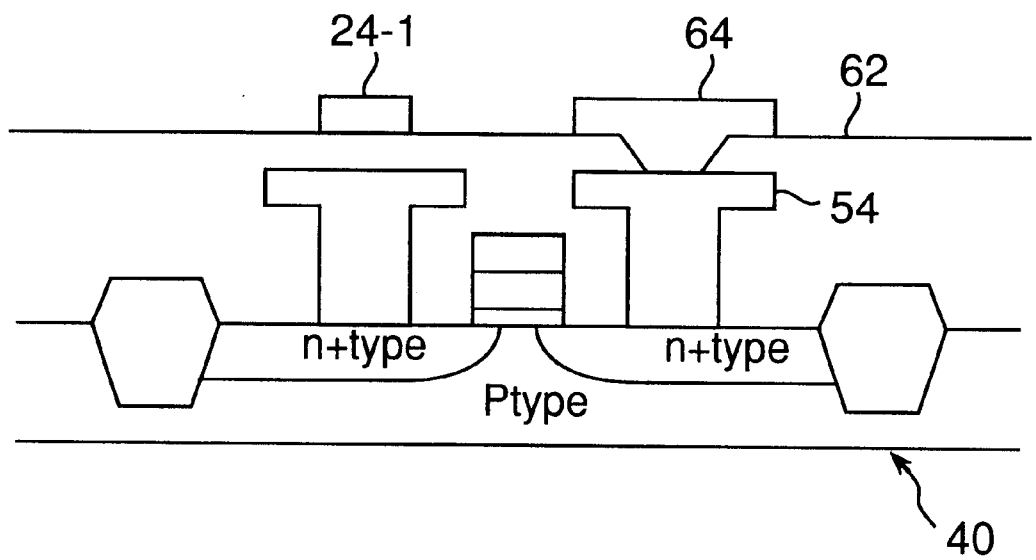
FIG. 7 is a diagram of the substrate in which a writing word line and a second isolated plug are further formed.

FIG. 7 shows the substrate 40 in which a wiring word line 24-1 and a second isolated plug 64 are further formed. An interlayer insulating film 62 is present in a region provided around the second isolated plug 64. The process to form interlayer insulating film 62 is just the same as that in the description with reference to FIG. 6. As described in the (5-1), an interlayer insulating film is further formed on the interlayer insulating film 52 (FIG. 6) and an interlayer insulating film 62 is thus formed. As described in the (5-2) and (5-3), next, the contact hole of the second isolated plug 64 is formed. The contact hole is extended to the upper portion of the first isolated plug 54 such that the second isolated plug 64 is electrically connected to the first isolated plug 54. As described in the (5-4), finally, a metal is deposited on the surfaces of the contact hole and the interlayer insulating film 62 and the unnecessary deposited meal is removed through the lithography and the etching such that the writing word line 24-1 and the second isolated plug 64 have desirable shapes. As described above, the writing word line 24-1 and the second isolated plug 64 are formed.

Figure 8:
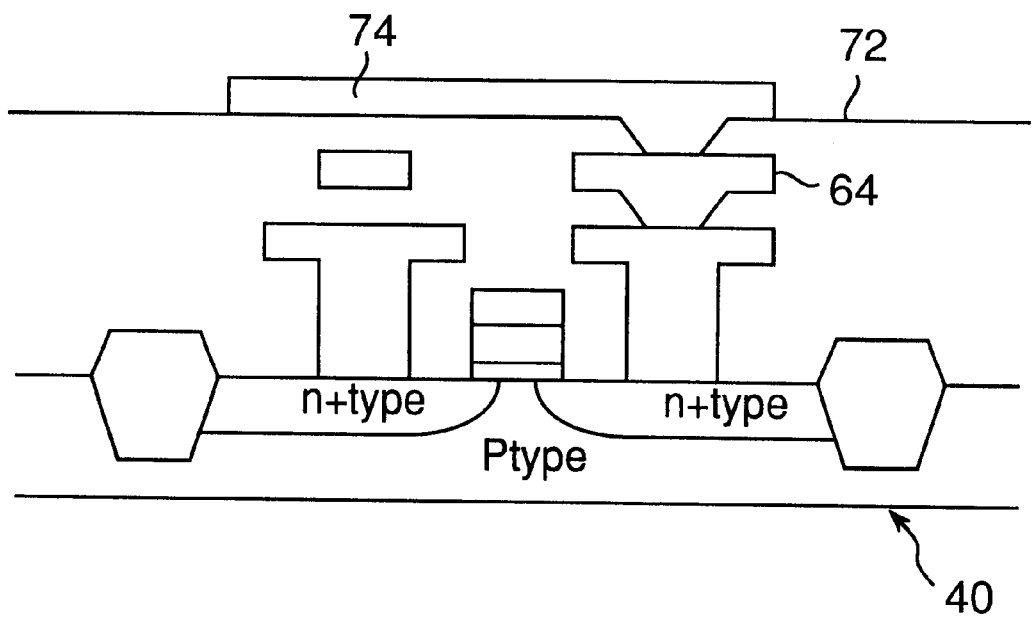
FIG. 8 is a diagram of the substrate in which a first lower electrode is further formed.

FIG. 8 shows the substrate 40 in which a first lower electrode 74 is further formed. The first lower electrode 74 is electrically connected to the second isolated plug 64. An interlayer insulating film 72 is present in a region provided around the first lower electrode 74. Since the interlayer insulating film 72 and the first lower electrode 74 are formed in just the same manner as in the description of the (5-1) to (5-4) with reference to FIGS. 6 and 7, description thereof will be omitted.

Figure 9:
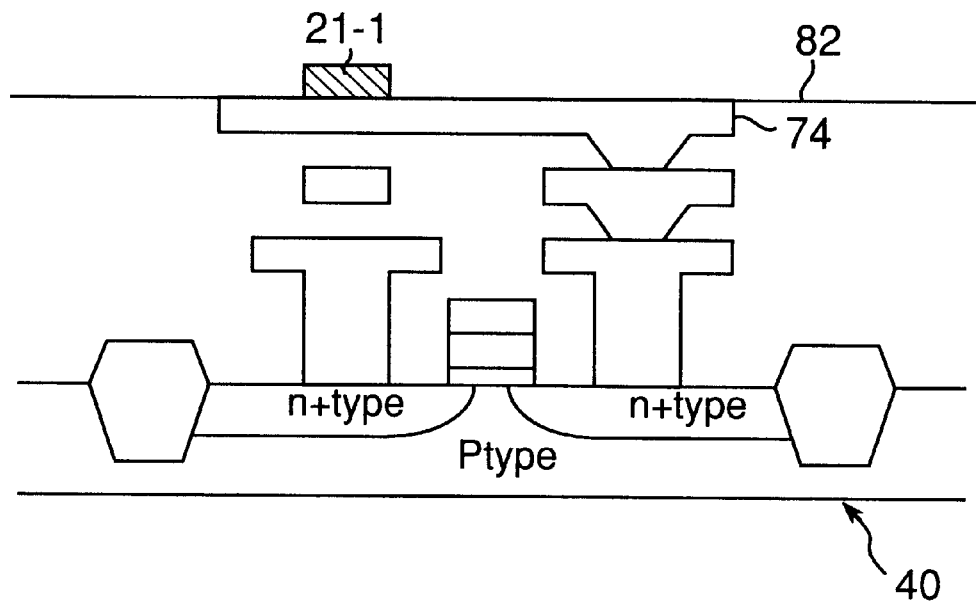
FIG. 9 is a diagram of the substrate in which a magnetic storage element is further formed.

FIG. 9 shows the substrate 40 in which a magnetic storage element 21-1 is further formed. The magnetic storage element 21-1 is electrically connected to the first lower electrode 74. As described above, the magnetic storage element 21-1 is a TMR element or a GMR element in which the ferromagnetic layer 33 (e.g. FIG. 4A), the non-magnetic layer 34 (e.g. FIG. 4) and the ferromagnetic layer 32 (e.g. FIG. 4) are provided sequentially from the side close to the substrate 40 and a writing word line. First of all, the TMR element or the GMR element is formed in conformity with the shape of the first lower electrode 74. Then, the photolithography and the etching (for example, ion etching) are carried out in the same manner as the above description in order to obtain a size and shape necessary for the magnetic storage element 21-1. As described above, the magnetic storage element 21-1 is formed. An interlayer insulating film 82 is formed to have almost the same level as the upper surface of the first lower electrode 74. Since the procedure for forming the interlayer insulating film 82 is just the same as in the above description, description thereof will be omitted.

Figure 10:
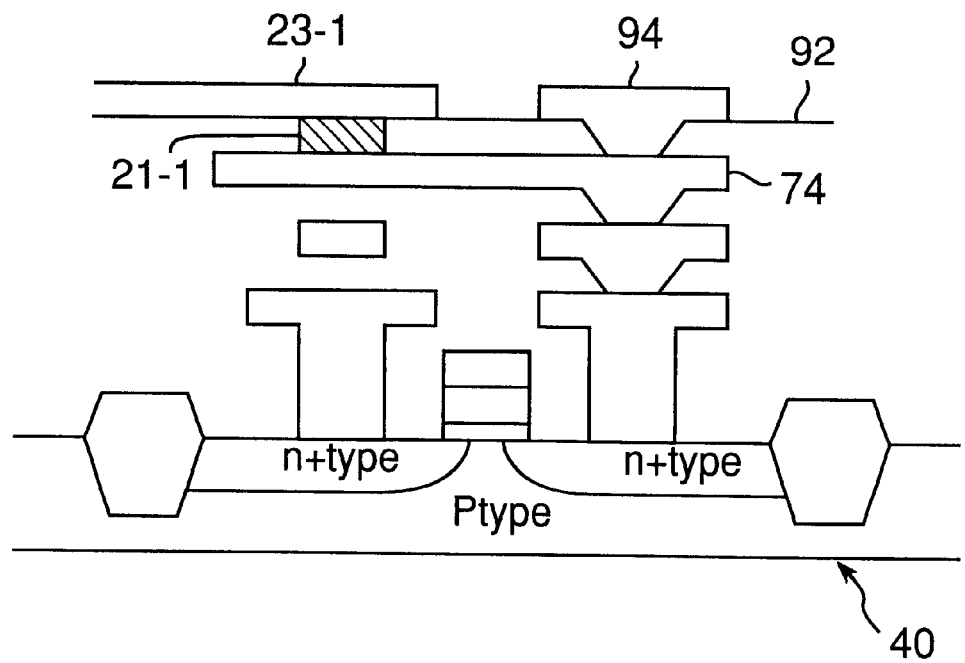
FIG. 10 is a diagram of the substrate in which a bit line and a third isolated plug are further formed.

FIG. 10 shows the substrate 40 in which a bit line 23-1 an a third isolated plug 94 are further formed. The bit line 23-1 is electrically connected to the magnetic storage element 21-1. On the other hand, the third isolated plug 94 is electrically connected to the first lower electrode 74. An interlayer insulating film 92 is present in a region provided around the bit line 23-1 and the third isolated plug 94. Since the bit line 23-1, the third isolated plug 94 and the interlayer insulating film 92 are formed in the same manner as in the description of the (5-1) to (5-4) with reference to FIGS. 6 and 7, description thereof will be omitted.

Thus, the first cell 27-1 (FIG. 3B) is formed. In the present invention, the degree of integration can be enhanced by further providing the second cell 27-2 (FIG. 3B) on the first cell 27-1 (FIG. 3B).

Figure 11:
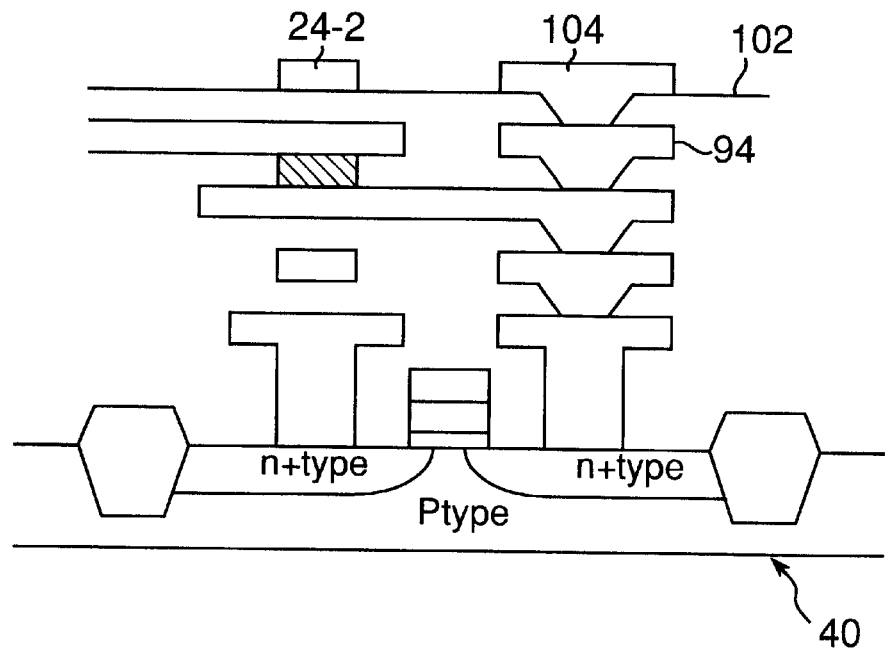
FIG. 11 is a diagram of the substrate in which a writing word line and a fourth isolated plug are further formed.

FIG. 11 shows the substrate 40 in which a writing word line 24-2 and a fourth isolated plug 104 are further formed. The fourth isolated plug 104 is electrically connected to the third isolated plug 94. An interlayer insulating film 102 is present in a region provided around the fourth isolated plug 104. Since the forming process completely corresponds to the process of forming the writing word line 24-1 and the second isolated plug 64 which have described with reference to FIG. 7, description thereof will be omitted.

Figure 12:
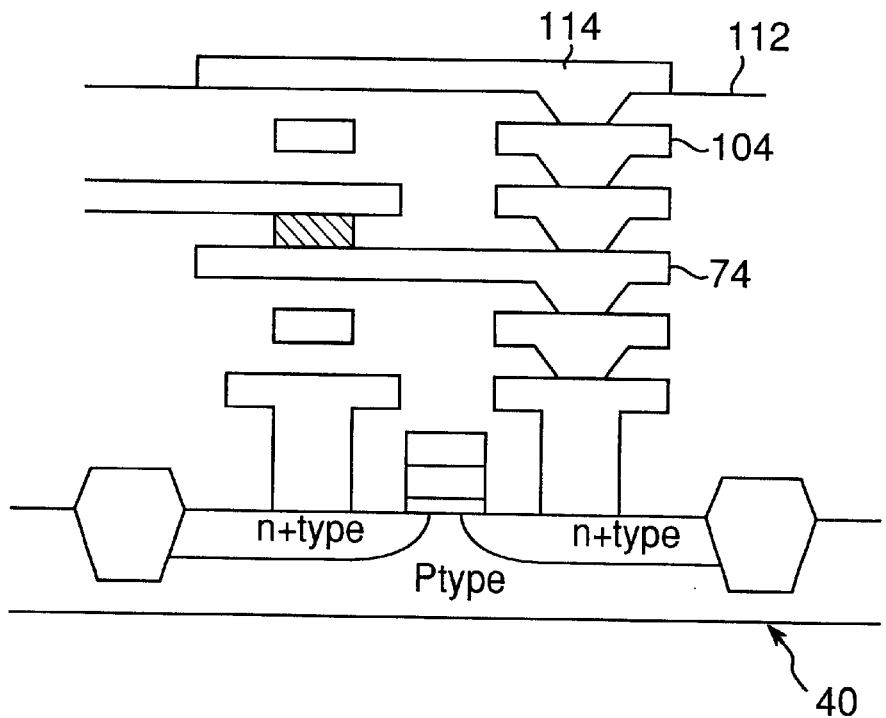
FIG. 12 is a diagram of the substrate in which a second lower electrode is further formed.

FIG. 12 shows the substrate 40 in which a second lower electrode 114 is further formed. The second lower electrode 114 is electrically connected to the fourth isolated plug 104. An interlayer insulating film 112 is present in a region provided around the second lower electrode 114. Since the forming process completely corresponds to the process of forming the first lower electrode 74 described with reference to FIG. 8, description thereof will be omitted.

Figure 13:
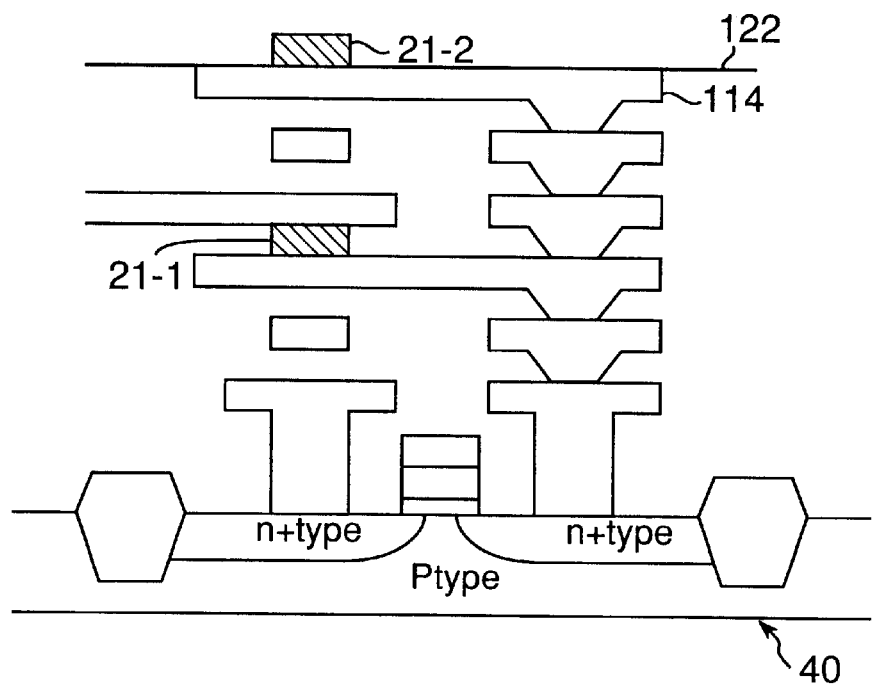
FIG. 13 is a diagram of the substrate in which a magnetic storage element is further formed.

FIG. 13 shows the substrate 40 in which a magnetic storage element 21-2 is further formed. The magnetic storage element 21-2 is electrically connected to the second lower electrode 114. An interlayer insulating film 122 is formed to have almost the same level as the upper surface of the second lower electrode 114. Since the structure of the magnetic storage element 21-2 and the forming process thereof completely correspond to the structure of the magnetic storage element 21-1 and the forming process thereof which have been described with reference to FIG. 9, description thereof will be omitted.

Figure 14:
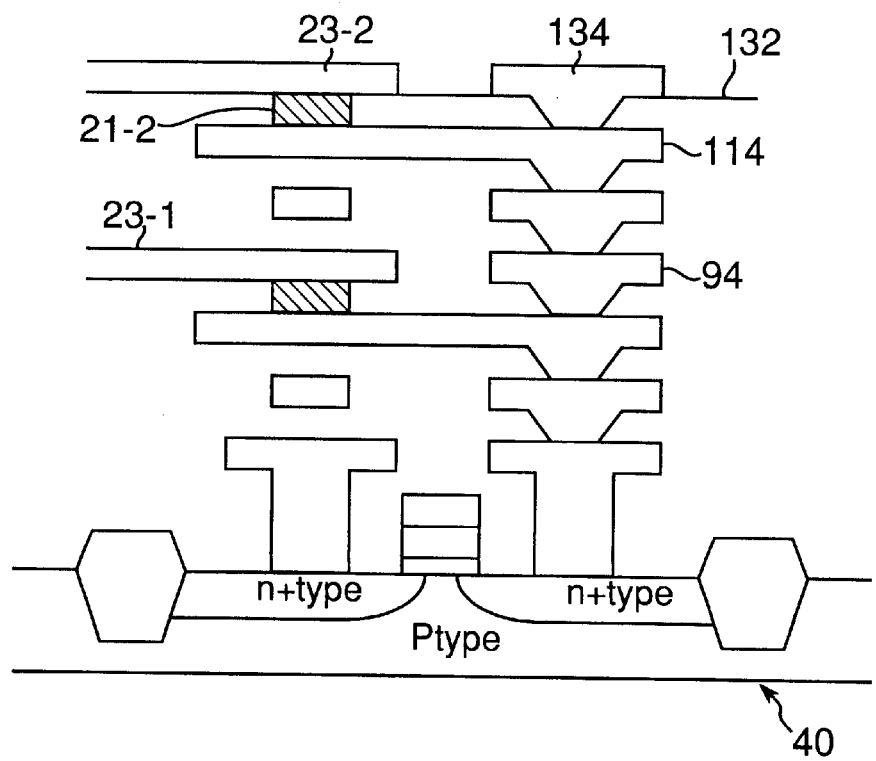
FIG. 14 is a diagram of the substrate in which a bit line and a fifth isolated plug are further formed.

FIG. 14 shows the substrate 40 in which a bit line 23-2 and a fifth isolated plug 134 are further formed. The bit line 23-2 is electrically connected to the magnetic storage element 21-2. On the other hand, the fifth isolated plug 134 is electrically connected to the second lower electrode 114. An interlayer insulating film 132 is present in a region provided around the bit line 23-2 and the fifth isolated plug 134. Since the forming process completely corresponds to the process of forming the bit line 23-1 and the third isolated plug 94 which have been described with reference to FIG. 10, description thereof will be omitted.

The process of manufacturing the magnetic memory cell unit 20 (FIG. 3B) has been described above. Referring to the description of FIG. 14, in the present embodiment, the magnetic memory cell unit 20 (FIG. 3B) is constituted by the two cells 27-1 and 27-2 (FIG. 3B). Therefore, the bit line 23-2 may be constituted to cover the upper surface of the interlayer insulating film 132 instead of providing the fifth isolated plug 134 (FIG. 14). On the other hand, in the case in which the magnetic memory cell unit 20 (FIG. 3B) including three or more cells is to be formed, it is preferable that the steps described with reference to FIGS. 11 to 14 should be repeated to provide the cells in a vertical direction to the transistor 22 (FIG. 5), thereby forming the magnetic memory cell unit 20 (FIG. 3B).

With reference to FIG. 3B again, a method of accessing the magnetic memory cell unit 20 will be described specifically. The "access" implies the write of information to the magnetic memory cell unit 20 and the read of the information from the magnetic memory cell unit 20. The access of the magnetic memory cell unit 20 is controlled by the driving circuit 12 (FIG. 2). All operations for "selecting a bit line", "writing/reading information", "applying a voltage", "causing current to flow" and the like which will be described below are carried out under the control of the driving circuit 12 (FIG. 2). These operations are carried out by causing the bit line driving circuit 13 (FIG. 2), the writing word line driving circuit 14 (FIG. 2) and the reading word line driving circuit 15 (FIG. 2) to select necessary wirings.

First of all, description will be given to the operation of the magnetic memory cell unit 20 which is to be carried out when information is to be written to the magnetic storage elements 21-1 and 21-2. For example, in the case in which the information is to be written to the magnetic storage element 21-2, the writing word line driving circuit 14 (FIG. 2) and the bit line driving circuit 13 (FIG. 2) first select the writing word line 24-2 and the bit line 23-2, thereby causing word line writing current and bit line writing current to flow, respectively. Composite magnetic field based on the current flowing to the writing word line 24-2 and the bit line 23-2 respectively is applied to the magnetic storage element 21-2 and the information is written to only the magnetic storage element 21-2. The information can be written to the magnetic memory cell unit 20 as described above.

In addition to such a normal writing method, the information can also be written by another method in order to enhance reliability for the writing operation. More specifically, the current is also caused to flow to the bit line 23-1 as well as the bit line 23-2 when the information is to be written to the magnetic storage element 21-2. The "reliability for the writing operation" implies that (i) desirable information is surely written to the magnetic storage element 21-2 and (ii) information is not erroneously written to the magnetic storage element 21-1 when the information is to be written to the magnetic storage element 21-2. A writing method for implementing (i) and (ii) will be described below.

Referring to (i), it is preferable that current should be caused to flow to the bit line 23-1 and the bit line 23-2 in the reverse direction in order to write desirable information more reliably. The magnetic storage element 21-2 is positioned between the bit lines 23-1 and 23-2. Accordingly, the current is caused to flow in the reverse direction so that magnetic field generated from the bit line 23-1 is further applied to the magnetic storage element 21-2 in the same direction as that of magnetic field generated from the bit line 23-2 based on the so-called Ampere's right-hand rule. Consequently, information can be recorded in the magnetic storage element 21-2 more reliably. At this time, it is preferable that the magnitude of the current flowing to the bit line 23-2 should be smaller than that of the current flowing to the bit line 23-1. When great current flows to the bit line 23-2, great magnetic field is applied to another storage element 21-1 so that the information might be written erroneously.

Referring to (ii), it is preferable that current should be caused to flow to both of the bit lines 23-1 and 23-2 in the reverse direction in order not to erroneously write the information to the magnetic storage element 21-1. The magnetic field generated from the bit line 23-2 is also applied to the magnetic storage element 21-1 as well as the magnetic storage element 21-2 to be intended. If the magnitude of the current flowing to the bit line 23-2 is increased for some reason, there is a possibility that the information might be erroneously written to the magnetic storage element 21-1. Accordingly, the current is caused to flow in the reverse direction so that the magnetic field generated from the bit line 23-1 is applied to the magnetic storage element 21-1 in the reverse direction to that of the magnetic field generated from the bit line 23-2, that is, the magnetic field is canceled based on the so-called Ampere's right-hand rule. Consequently, it is possible to prevent the information from being erroneously written to the magnetic storage element 21-1. At this time, it is preferable that the magnitude of the current flowing to the bit line 23-1 should be smaller than that of the current flowing to the bit line 23-2. The reason is as follows. If great current flows to the bit line 23-1, great magnetic field is also applied to the magnetic storage element 21-1 so that the information might be erroneously written. In addition, since the magnetic field is proportional to a distance from the current, the magnetic field generated from the bit line 23-2 can be offset even if the magnitude of the current flowing to the bit line 23-1 is small.

As is apparent from the above description, it is concluded that both (i) and (ii) can be implemented by causing the current to flow to both the bit line 23-1 and the bit line 23-2 in the reverse direction. Based on this conclusion, in the case in which the magnetic memory cell unit formed of three or more cells is utilized, the following can be generalized. More specifically, it is preferable that smaller current should be caused to flow to a bit line positioned above an object bit line corresponding to an object magnetic storage element in the same direction as the object bit line and smaller current should be caused to flow to a bit line positioned below the object bit line in the reverse direction to the object bit line. Consequently, great magnetic field is applied by the object magnetic storage element and magnetic field to be applied to the magnetic storage element other than the object magnetic storage element can be offset. Thus, a writing property can be enhanced.

The magnitude of the current to flow to the bit line other than the object bit line may be identical to each other or different from each other.

Referring to an operation for reading information from each of the magnetic storage elements 21-1 and 21-2, the driving circuit 12 (FIG. 2) is operated as described with reference to FIGS. 4C and 4D. For example, description will be given to the case in which the driving circuit 12 (FIG. 2) reads the information stored in the magnetic storage element 21-2. The reading word line driving circuit 15 (FIG. 2) first selects a reading word line 25 and applies a reading word line voltage to turn on the transistor 22. A third terminal 22-3 of the transistor 22 is grounded. Therefore, one of the terminals of the magnetic storage element 21-2 has a voltage of 0 V (reference voltage). Subsequently, the bit line driving circuit 13 (FIG. 2) selects the bit line 23-2 and causes constant current to flow from the bit line 23-2 to the magnetic storage element 21-2. The bit line driving circuit 13 (FIG. 2) detects a voltage between the terminals of the magnetic storage element 21-2 and obtains a resistance value of the magnetic storage element 21-2. The driving circuit 12 (FIG. 2) decides that the information held in the magnetic storage element 21-2 is "0" if the resistance value of the magnetic storage element 21-2 has a comparatively small predetermined value, and decides that the information held in the magnetic storage element 21-2 is "1" if the resistance value of the magnetic storage element 21-2 has a comparatively great predetermined value. The decision is not restricted to the resistance value but a detected voltage value may be utilized as it is.

In order to read the information more accurately, another bit line 23-1 may be utilized as a reference bit line. In the case in which the information stored in the magnetic storage element 21-2 is read out, the reference current is caused to flow to the bit line 23-1 as well as the bit line 23-2. At this time, a set value which is recognized in advance by the bit line driving circuit 13 (FIG. 2), for example, "1" is stored in the magnetic storage element 21-1. If the resistance value of the magnetic storage element 21-2 thus detected is equal to the resistance value (reference resistance value) of the magnetic storage element 21-1, it is possible to decide that "1" is stored in the magnetic storage element 21-2. If they are different from each other, it is possible to decide that "0" is stored in the magnetic storage element 21-2. This decision is not restricted to the resistance value but the detected voltage value may be utilized as it is. Consequently, the driving circuit 12 (FIG. 2) can read information more accurately. The set value is not restricted to "0" or "1" but may be a resistance value, a current value, a voltage value or the like which is recognized in advance. For example, based on the decision that the detected resistance value of the magnetic storage element is equal to the reference resistance value as a set value, the information stored in the magnetic storage element can be read as "1" if the resistance value of the magnetic storage element is greater than the set value and can be read as "0" if the resistance value of the magnetic storage element is smaller than the set value.

The magnetic memory cell unit is formed by providing a plurality of cells, each of the plurality of cells including a magnetic storage. element in a vertical direction to a single transistor. Usually, independent information (information indicative of "0" or "1") is stored in the magnetic storage element. However, it is possible to carry out the writing and reading operations to represent an N-digit binary number by utilizing N magnetic storage elements provided in a single magnetic memory cell unit. Since the magnetic memory cell unit 20 shown in FIGS. 3A and 3B include two magnetic storage elements, it can represent a 2-digit binary number. For example, the magnetic storage element 21-1 represents a lower bit and the magnetic storage element 21-2 represents a higher bit. As another example, by utilizing the magnetic memory cell unit 140 including four magnetic storage elements shown in FIG. 15, a 4-digit binary number can be represented. The magnetic memory cell unit 140 can be formed by providing four cells indicated as the first cell 27-1 (FIGS. 3A and 3B) and the second cell 27-2 (FIGS. 3A and 3B). As a further example, by utilizing a magnetic memory cell unit including eight magnetic storage elements, an 8-digit binary number, that is, 1-byte information can be stored. Such a magnetic memory cell unit can be formed by providing eight cells. Thus, related bit information can be stored by utilizing one magnetic memory cell unit and can be handled, for example. Consequently, memory management can be carried out easily.

According to the magnetic random access memory of the present invention, a plurality of magnetic storage elements are connected to a single transistor. Therefore, it is possible to obtain a memory having the small number of components and high degree of integration. More specifically, the magnetic storage elements are laminated in the vertical direction to the transistor. Therefore, the degree of integration can be enhanced dramatically.

According to the magnetic random access memory of the present invention, a third terminal to which a predetermined voltage is applied is further provided and current flows to a second terminal through the third terminal based on a voltage applied to a first terminal. Consequently, it is possible to detect a voltage for reading information.

The writing operation of information to the magnetic random access memory according to the present invention is carried out by utilizing magnetic field generated by bit line writing current and word line writing current. Therefore, it is possible to specify a desirable one of the magnetic storage elements, thereby writing the information. The plurality of writing word lines are orthogonal to the plurality of bit lines, respectively, and the magnetic storage element is positioned between the writing word line and the bit line. Therefore, the greater composite magnetic field is applied to the magnetic storage element and the writing operation can be carried out reliably.

When information is to be recorded in the magnetic random access memory according to the present invention, current is caused to flow to at least one of the bit lines other than a bit line to be selected. Consequently, a writing property can be enhanced. The magnitude of the current on the at least one bit line is smaller than that of the bit line writing current. Therefore, the information is not erroneously written to the other magnetic storage elements. Furthermore, greater magnetic field is applied to the magnetic storage element to be a writing object. Therefore, the information can be written more reliably. Moreover, the direction of the current on at least one bit line can be changed corresponding to the positional relationship between the at least one bit line and an object bit line. Consequently, it is possible to write information having high reliability in consideration of the direction of the magnetic field to be applied to the magnetic storage element. More specifically, in the case in which at least one bit line is positioned above an object bit line, current is caused to flow in the same direction as the object bit line. If at least one bit line is positioned below the object bit line, current is caused to flow in the reverse direction to the object bit line. Consequently, the information can be written to the storage element accurately. Furthermore, it is possible to prevent the information from being erroneously written to the other storage elements.

Moreover, information is recorded to represent an N-digit binary number by using N magnetic storage elements. Consequently, the related bit information can be handled collectively. Consequently, it is possible to obtain a magnetic random access memory capable of easily carrying out memory management.

Furthermore, the contents of the stored information are decided by utilizing the reference terminal voltage of the magnetic storage element connected to a reference bit line different from the object bit line in addition to the original terminal voltage of the magnetic storage element. Therefore, it is possible to read information more accurately.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A magnetic random access memory comprising:
   a plurality of magnetic storage elements for magnetically storing information;
   a plurality of bit lines, each of which connected to each of the plurality of magnetic storage elements;
   a plurality of writing word lines, each of which is provided in correspondence to the vicinity of each of the plurality of magnetic storage elements and utilized for applying magnetic field to write the information;

a single reading word line; and a switch including a first terminal and a second terminal, the first terminal being connected to the single reading word line to be utilized for determining whether current is caused to flow to the second terminal, the second terminal being connected to each of the plurality of magnetic storage elements.

2. The magnetic random access memory according to claim 1, wherein the switch further includes a third terminal which is different from both the first terminal and the second terminal and to which a predetermined voltage is applied, current flowing to the second terminal through the third terminal based on the voltage applied to the first terminal.

3. The magnetic random access memory according to claim 1, wherein the plurality of magnetic storage elements are laminated in a vertical direction to the switch.

4. The magnetic random access memory according to claim 3, wherein each of the plurality of magnetic storage elements is positioned between corresponding one of the plurality of writing word lines and bit lines which are orthogonalized.

5. A method of writing information to the magnetic random access memory according to claim 1, comprising the steps of:

causing bit line writing current to flow to a selected bit line corresponding to a selected magnetic storage element;

causing word line writing current to flow to a selected writing word line corresponding to the selected magnetic storage element; and changing a direction of magnetization of the selected magnetic storage element into a direction in compliance with the information through the magnetic field generated by the bit line writing current and the word line writing current.

6. The method of writing information according to claim 5, further comprising the step of causing current to flow to at least one bit line other than the selected bit line.

7. The method of writing information according to claim 6, wherein the current to flow to the at least one bit line has a smaller magnitude than that of the bit line writing current.

8. The method of writing information according to claim 6, wherein at the step of causing current to flow to the at least one bit line, a direction of current flow is changed according to a positional relationship between the at least one bit line and the selected bit line.

9. The method of writing information according to claim 8, wherein at the step of causing current to flow to the at least one bit line, the current is caused to flow in the same direction as the selected bit line if the at least one bit line is positioned above the selected bit line, and the current is caused to flow in a reverse direction to the selected bit line if the at least one bit line is positioned below the selected bit line.

10. The method of writing information according to claim 4, wherein the information is recorded to represent an N-digit binary number by using the N magnetic storage elements.

11. A method of reading information from the magnetic random access memory according to claim 1, comprising the steps of:

applying a reading word line voltage to the single reading word line;

causing bit line reading current to flow to a selected bit line corresponding to the selected magnetic storage element;

detecting a terminal voltage of the selected magnetic storage element; and deciding contents of the stored information based on the terminal voltage.

12. The method of reading information from the magnetic random access memory according to claim 11, further comprising the steps of:

causing reference current to flow to a reference bit line different from the selected bit line;

detecting a reference terminal voltage of the magnetic storage element connected to the reference bit line; and deciding contents of the stored information based on the reference terminal voltage and the terminal voltage.

13. A method of manufacturing a magnetic random access memory, comprising the steps of:

(a) providing a substrate;

(b) forming a single transistor including a first electrode, a second electrode and a third electrode on the substrate, the second electrode being conducted to the third electrode in response to a voltage to be applied to the first electrode;

(c) forming a writing word line insulated from the single transistor;

(d) forming a magnetic storage element connected to the second electrode of the single transistor for storing information in the vicinity of the writing word line;

(e) forming a bit line connected to the magnetic storage element and insulated from the writing word line; and (f) repeating the steps (c) to (e).

14. The method of manufacturing the magnetic random access memory according to claim 13, wherein at the steps (c) to (f), the writing word line, the magnetic storage element and the bit line are laminated in a vertical direction to the single transistor formed on the substrate.

15. The method of manufacturing the magnetic random access memory according to claim 14, wherein the step (d) further includes the step of forming a single reading word line to be connected to the first electrode.

16. The method of manufacturing the magnetic random access memory according to claim 15, wherein at the steps (c) to (e), the writing word line is orthogonal to the bit line, and the writing word line, the magnetic storage element and the bit line are formed such that the magnetic storage element is positioned between the writing word line and the bit line.

17. The method of manufacturing the magnetic random access memory according to claim 16, wherein the step (b) further includes the step of giving a predetermined voltage to the third electrode.

* * * * *